US009741757B2

(12) United States Patent
Ootsuka et al.

(10) Patent No.: US 9,741,757 B2
(45) Date of Patent: Aug. 22, 2017

(54) SOLID-STATE IMAGING DEVICE WITH LAYERED MICROLENSES AND METHOD FOR MANUFACTURING SAME

(71) Applicant: SONY CORPORATION, Tokyo (JP)

(72) Inventors: Yoichi Ootsuka, Kumamoto (JP); Tomoyuki Yamashita, Kumamoto (JP); Kiyotaka Tabuchi, Kumamoto (JP); Yoshinori Toumiya, Kumamoto (JP); Akiko Ogino, Kumamoto (JP)

(73) Assignee: Sony Corporation, Tokyo (JP)

( * ) Notice: Subject to any disclaimer, the term of this patent is extended or adjusted under 35 U.S.C. 154(b) by 155 days.

(21) Appl. No.: 14/861,175

(22) Filed: Sep. 22, 2015

(65) Prior Publication Data
US 2016/0013234 A1 Jan. 14, 2016

Related U.S. Application Data

(63) Continuation of application No. 13/613,261, filed on Sep. 13, 2012, now Pat. No. 9,159,760.

(30) Foreign Application Priority Data

Sep. 30, 2011 (JP) .................................. 2011-217423

(51) Int. Cl.
H01L 27/146 (2006.01)
H04N 5/335 (2011.01)
(52) U.S. Cl.
CPC .. H01L 27/14627 (2013.01); H01L 27/14612 (2013.01); H01L 27/14621 (2013.01); H01L 27/14685 (2013.01); H04N 5/335 (2013.01)

(58) Field of Classification Search
CPC .......... H01L 51/5275; H01L 27/14625; H01L 27/14627; H01L 27/14825; H01L 27/14831; H01L 27/14621; H01L 31/02162; G02B 3/00
See application file for complete search history.

(56) References Cited

U.S. PATENT DOCUMENTS

| 6,617,189 | B1 | 9/2003 | Chen et al. |
| 6,831,311 | B2 | 12/2004 | Uchida |
| 9,159,760 | B2 | 10/2015 | Ootsuka et al. |
| 2003/0197210 | A1 | 10/2003 | Uchida |
| 2005/0133688 | A1 | 6/2005 | Li et al. |
| 2007/0096016 | A1 | 5/2007 | Li et al. |
| 2011/0180695 | A1* | 7/2011 | Li ........................ G02B 3/0018 250/216 |

(Continued)

FOREIGN PATENT DOCUMENTS

| CN | 1435892 A | 8/2003 |
| CN | 1819248 A | 8/2006 |

(Continued)

Primary Examiner — Francis M Legasse, Jr.
(74) Attorney, Agent, or Firm — Wolf, Greenfield & Sacks, P.C.

(57) ABSTRACT

A solid-state imaging device includes: a first lens layer; and a second lens layer, wherein the second lens layer is formed at least at a periphery of each first microlens formed based on the first lens layer, and the second lens layer present at a central portion of each of the first microlenses is thinner than the second lens layer present at the periphery of the first microlens or no second lens layer is present at the central portion of each of the first microlenses.

20 Claims, 10 Drawing Sheets

(56) References Cited

U.S. PATENT DOCUMENTS

2013/0082165 A1   4/2013   Ootsuka et al.

FOREIGN PATENT DOCUMENTS

| CN | 101154676 A | 4/2008 |
| CN | 101888489 A | 11/2010 |
| JP | 64-010666 | 1/1989 |
| JP | 2007-053318 | 3/2007 |
| JP | 2008-009079 | 1/2008 |
| JP | 2008-277800 | 11/2008 |
| TW | 513809 B | 12/2002 |

* cited by examiner

SOLID-STATE IMAGING DEVICE WITH LAYERED MICROLENSES AND METHOD FOR MANUFACTURING SAME

CROSS-REFERENCE TO RELATED APPLICATION

The present application is a continuation of U.S. patent application Ser. No. 13/613,261 filed on Sep. 13, 2012 which claims priority of Japanese Patent Application No. JP 2011-217423 filed in the Japan Patent Office on Sep. 30, 2011, the entire contents of which are hereby incorporated by reference.

FIELD

The technology of the present disclosure relates to a solid-state imaging device, a method for manufacturing the solid-state imaging device, and an electronic apparatus, and particularly to a solid-state imaging device including microlenses on photodiodes, a method for manufacturing the solid-state imaging device, and an electronic apparatus.

BACKGROUND

CMOS (complementary metal oxide semiconductor) solid-state imaging devices are known to be classified into a front-illumination type and a rear-illumination type. A solid-state imaging device of either of the two types includes a pixel region in which a plurality of unit pixels are formed on a semiconductor base substrate and each of the unit pixels is formed of a photodiode that works as a photoelectric converter and a plurality of pixel transistors.

In a front-illumination solid-state imaging device, the front surface of a substrate on which a multilayer wiring layer is formed works as a light receiving surface, and light is incident on the front surface of the substrate.

In a rear-illumination solid-state imaging device, the rear surface of the substrate that faces away from the front surface of the substrate on which a multilayer wiring layer and pixel transistors are formed works as a light receiving surface, and light is incident on the rear surface of the substrate.

The photodiodes are isolated from each other by a device isolating region formed of an impurity diffusion layer. Further, the multilayer wiring layer, in which a plurality of wiring lines are disposed, is formed via an interlayer insulating layer on the front surface of the semiconductor base substrate, on which the pixel transistors are formed.

In a front-illumination solid-state imaging device, the wiring lines are formed in regions other than the photodiodes. On-chip color filters and microlenses are sequentially formed via a planarization layer on the multilayer wiring layer. The on-chip filters are formed, for example, of an array of red (R), green (G), and blue (B) filters.

In a rear-illumination solid-state imaging device, the wiring lines can be formed irrespective of the positions of the photodiodes. An insulating layer, on-chip color filters, and microlenses are sequentially formed on the rear surface of the semiconductor base substrate, which works as the light receiving surface of the photodiodes.

In a rear-illumination solid-state imaging device, since the multilayer wiring layer does not constrain light from entering the photodiodes in any manner, each of the photodiodes can be provided with a large opening. Further, the distance from the photodiodes to the microlenses can be shortened, as compared with that in a front-illumination solid-state imaging device. Shortening the distance can improve the ability of the microlenses to collect light, whereby obliquely incident light can also be efficiently introduced. As a result, the sensitivity of the solid-state imaging device can be increased.

To improve the ability of the microlenses to collect light, for example, the curvature of each of the microlenses may be increased, or the refractive index of the material of which the microlenses are made may be increased (see JP-A-2007-53318, JP-A-1-10666, JP-A-2008-277800, and JP-A-2008-9079).

SUMMARY

The solid-state imaging device described above is typically required to improve their sensitivity characteristics by optimizing the shape of the microlenses.

Thus, it is desirable to provide a solid-state imaging device having excellent sensitivity characteristics, a method for manufacturing the solid-state imaging device, and an electronic apparatus using the solid-state imaging device by using the technology of the present disclosure.

An embodiment of the technology of the present disclosure is directed to a solid-state imaging device including a first lens layer and a second lens layer, and the second lens layer is formed at least at a periphery of each first microlens formed based on the first lens layer. The second lens layer present at a central portion of each of the first microlenses is thinner than the second lens layer present at the periphery of the first microlens, or no second lens layer is present at the central portion of each of the first microlenses.

Another embodiment of the technology of the present disclosure is directed to an electronic apparatus including the solid-state imaging device described above and a signal processing circuit that processes an output signal from the solid-state imaging device.

Still another embodiment of the technology of the present disclosure is directed to a method for manufacturing a solid-state imaging device including forming first microlenses having an inter-pixel gap therebetween based on a first lens layer, and forming a second lens layer at least at a periphery of each of the first microlenses. In the formation of the second lens layer, the second lens layer formed at a central portion of each of the first microlenses is thinner than the second lens layer formed at the periphery of the first microlens, or no second lens layer is present at the central portion of each of the first microlenses.

According to the solid-state imaging device described above and the solid-state imaging device manufactured using the manufacturing method described above, the first microlenses having an inter-pixel gap therebetween are formed based on the first lens layer, and the second lens layer is formed at the periphery of each of the first microlenses. The second lens layer formed at the periphery of each of the first microlenses fills the inter-pixel gap between the first microlenses. The area of each of the microlenses in a plan view is therefore enlarged, whereby the ability of the microlens to collect light is improved. As a result, the sensitivity characteristics of the solid-state imaging device are improved. An electronic apparatus having excellent sensitivity characteristics can thus be configured by incorporating the solid-state imaging device.

According to the embodiments of the technology of the present disclosure, a solid-state imaging device having excellent sensitivity characteristics, a method for manufacturing the solid-state imaging device, and an electronic apparatus can be provided.

DETAILED DESCRIPTION

An example of the mode for carrying out the technology of the present disclosure will be described below. It is, however, noted that the technology of the present disclosure is not limited to the following example.

The description will be made in the following order.
1. Embodiment of solid-state imaging device
2. Embodiment of method for manufacturing solid-state imaging device
3. Embodiment of electronic apparatus <1. Embodiment of Solid-State Imaging Device>
[Example of Configuration of Solid-State Imaging Device: Schematic Configuration Diagram]

A specific form of a solid-state imaging device according to the present embodiment will be described below.

Figure 1:
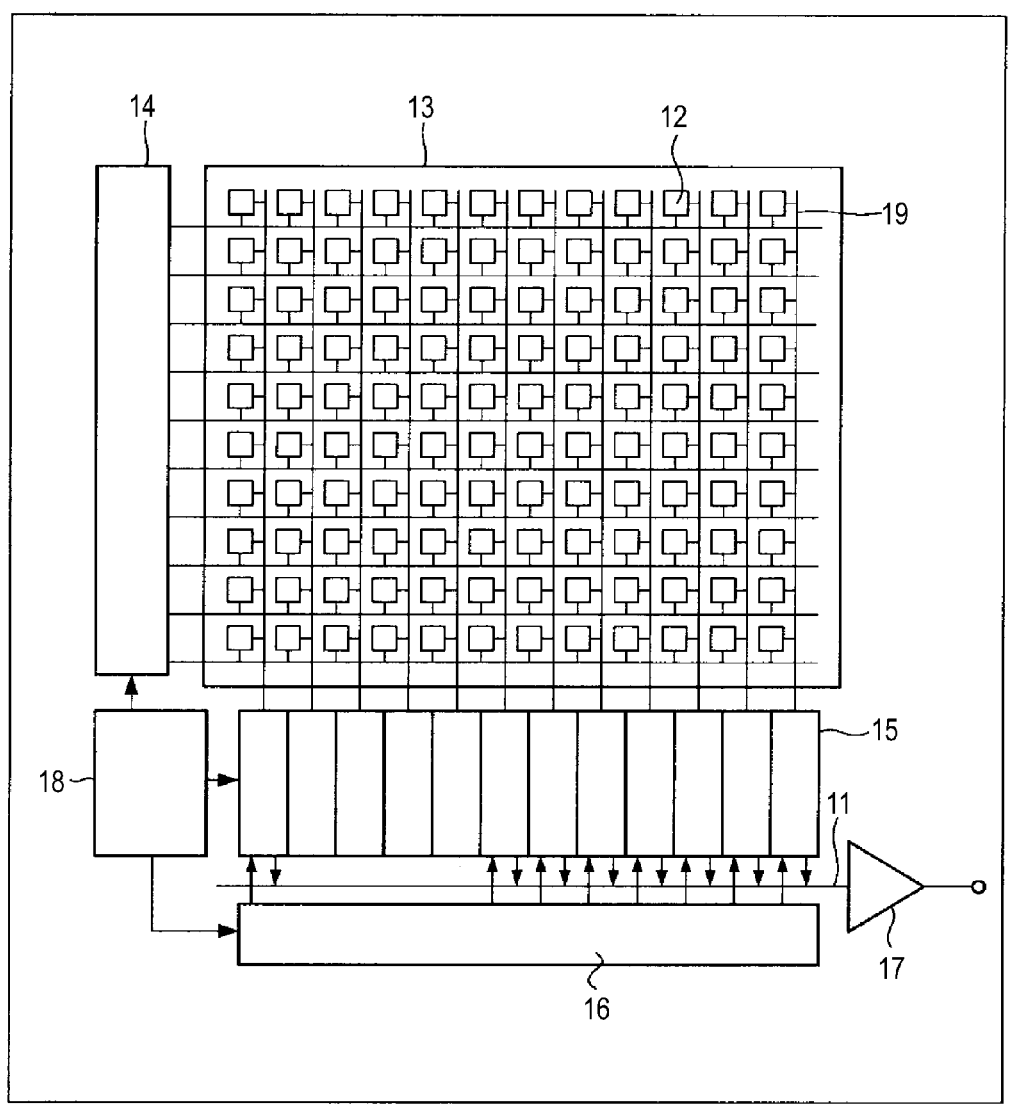
FIG. 1 is a plan view showing the configuration of a solid-state imaging device according to an embodiment.

FIG. 1 is a schematic configuration diagram showing a MOS (metal oxide semiconductor) solid-state imaging device as an example of the solid-state imaging device.

A solid-state imaging device 10 shown in FIG. 1 is formed of a pixel section (what is called imaging region) 13 and a peripheral circuit section. In the pixel section 13, pixels 12, each of which includes a photodiode, are regularly and two-dimensionally arranged as a plurality of photoelectric converters on a silicon substrate or any other semiconductor base substrate. Each of the pixels 12 includes a photodiode and a plurality of pixel transistors (what is called MOS transistor).

The plurality of pixel transistors can be formed, for example, of three transistors: a transfer transistor; a rest transistor; and an amplification transistor. The plurality of pixel transistors can alternatively be formed of four transistors: those described above and an additional selection transistor.

The peripheral circuit section is formed of a vertical drive circuit 14, column signal processing circuits 15, a horizontal drive circuit 16, an output circuit 17, and a control circuit 18.

The control circuit 18 produces a clock signal and a control signal based on a vertical sync signal, a horizontal sync signal, and a master clock, and the produced clock signal and control signal serve as references according to which the vertical drive circuit 14, the column signal processing circuits 15, the horizontal drive circuit 16, and other components operate. The control circuit 18 inputs the signals into the vertical drive circuit 14, the column signal processing circuits 15, the horizontal drive circuit 16, and other components.

The vertical drive circuit 14 is formed, for example of a shift resistor. The vertical drive circuit 14 selects and scans the pixels 12 in the pixel section 13 sequentially in the vertical direction on a row basis and supplies the column signal processing circuits 15 with pixel signals based on signal charge produced in accordance with the amount of light received by the photoelectric conversion devices in the selected pixels 12 via vertical signal lines 19.

Each of the column signal processing circuits 15 is disposed in accordance with a certain unit of pixels 12, for example, on a pixel column and performs noise reduction or otherwise processes signals outputted from the pixels 12 in a single row by using a signal from black reference pixels (formed around effective pixel region) on a pixel column basis. That is, the column signal processing circuits 15 perform CDS (correlated double sampling) for removing a fixed pattern noise specific to the pixels 12, signal amplification, and other types of signal processing. Each of the column signal processing circuits 15 has a horizontal selection switch (not shown) provided at its output stage and connected to a horizontal signal line 11.

The horizontal drive circuit 16 is formed, for example, of a shift resistor. The horizontal drive circuit 16 sequentially selects each of the column signal processing circuits 15 by successively outputting a horizontal scan pulse and outputs pixel signals from each of the column signal processing circuits 15 to the horizontal signal line 11.

The output circuit 17 performs signal processing on the signals sequentially supplied from each of the column signal processing circuits 15 through the horizontal signal line 11 and outputs the processed signals.

When the solid-state imaging device 10 described above is used as a rear-illumination solid-state imaging device, no wiring layer is formed on the rear surface (what is called light receiving surface) on the side on which light is incident, but a wiring layer is formed on the front surface facing away from the light receiving surface.

[Example of Configuration of Solid-State Imaging Device: Pixel Section]

Figure 2:
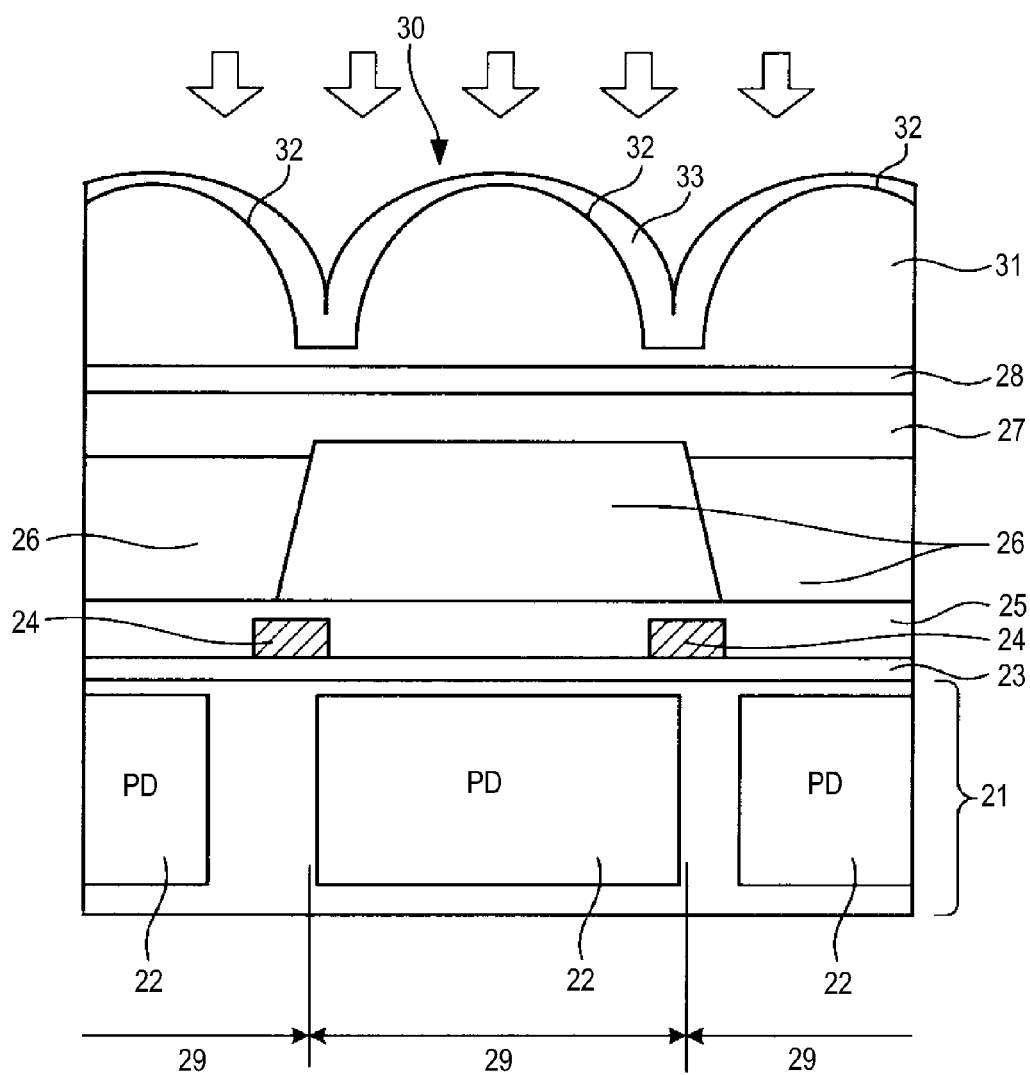
FIG. 2 is a cross-sectional view showing the configuration of a pixel section of the solid-state imaging device according to the embodiment.

FIG. 2 is a cross-sectional view showing a key portion that forms a single pixel of the solid-state imaging device according to the present embodiment.

A solid-state imaging device 20 shown in FIG. 2 includes a plurality of photodiodes (PDs) 22 on the side of a semiconductor base substrate 21 on which light is incident. Each of the PDs 22 is formed in a unit pixel 29 of the solid-state imaging device 20. An insulating layer 23 formed of a single layer or multiple layers is formed on the semiconductor base substrate 21.

In the rear-illumination solid-state imaging device 20 shown in FIG. 2, a circuit section including a multilayer wiring layer and pixel transistors is formed on the surface facing away from the surface on which light is incident, but the configuration of the circuit section is omitted in FIG. 2.

The insulating layer 23, when formed of a single layer, is made, for example, of SiO. The insulating layer 23, when formed of multiple layers, is formed of multiple layers having different refractive indices based on the configuration of an antireflection layer. For example, the insulating layer 23 is formed of two layers: a hafnium oxide ($HfO_2$) layer and a silicon oxide layer.

An inter-pixel light blocking layer 24 is formed on the insulating layer 23 described above, specifically, along the boundary between the unit pixels 29 in correspondence with an opening of each of the PDs 22 of the solid-state imaging device 20. The inter-pixel light blocking layer 24 is formed, for example, of a layer made of W, Al, Cu, or any other suitable metal or carbon black, a titanium black, or any other suitable organic material. The inter-pixel light blocking layer 24 prevents incident light from leaking to an adjacent pixel and hence suppress color mixture in the solid-state imaging device 20.

A first planarization layer 25 made, for example, of an acrylic resin is formed on the insulating layer 23 and the inter-pixel light blocking layer 24. The first planarization layer 25 planarizes protrusions and recesses resulting from the inter-pixel light blocking layer 24 and other factors. The first planarization layer 25 further reduces application unevenness that occurs when color filters are formed on the semiconductor base substrate 21, for example, in a spin application process.

Color filters 26 are formed on the first planarization layer 25. The color filters 26 are formed of a variety of optical filters, such as RED, GREEN, BLUE, YELLOW, CYAN, MAGENTA optical filters. In the formation of the color filters 26, the layer thickness for each of the colors is so optimized that an optimum color image is outputted. The surface of the entire color filters 26 therefore has protrusions and recesses to some extent.

A second planarization layer 27 for planarizing the protrusions and recesses resulting from the surfaces of the color filters 26 is formed on the color filters 26. The second planarization layer 27 is made of a material that has thermal fluidity and thermal curability and forms a cured layer when a thermal treatment is finished, such as an acrylic resin, a styrene resin, and a styrene-acryl copolymerizing resin. The planarization ability of the materials described above decreases in the following order: an acrylic resin, a styrene-acryl copolymerizing resin, and a styrene resin. The second planarization layer 27 is therefore preferably made of an acrylic resin, which excels in the planarization ability.

A buffer layer 28 is formed on the second planarization layer 27. The buffer layer 28 is made, for example, of SiO or SiON. The buffer layer 28 is formed to prevent corrugation due to the difference in film stress or reduce the reflectance, as will be described later.

Microlenses 30 are formed on the buffer layer 28.

The microlenses 30 are formed of a first lens layer 31 and a second lens layer 33 formed on the first lens layer 31. The first lens layer 31 is formed over the second planarization layer 27 and forms first microlenses 32. The second lens layer 33 is then so formed that it covers the first microlenses 32. The second planarization layer 27 is formed to increase uniformity of the first microlenses 32 formed over the color filters 26.

The first lens layer 31, which forms the microlenses 30 in the solid-state imaging device 20, is made of one or more of the following materials: a resin, SiN, and SiON.

The resin is, for example, a metal-oxide-containing resin in which metal fine particles are dispersed. Examples of the resin in which metal fine particles are dispersed include an acrylic resin, a styrene-based resin, a novolac resin, an epoxy-based resin, a polyimide-based resin, and a siloxane-based resin. Examples of the metal fine particles that are dispersed in the resin include a zinc oxide, a zirconium oxide, a niobium oxide, a titanium oxide, and a tin oxide. Dispersing a metal oxide in a resin increases the refractive index of the resin.

When the first lens layer 31 is made of SiN and the second planarization layer 27 is made of an acrylic resin, formation of SiN directly on the second planarization layer 27 may produce corrugation along the interface between the two layers in some cases due to stress induced when the SiN layer is formed. Corrugation degrades an image produced by the solid-state imaging device.

Corrugation results from the difference in membrane stress between the resin that form the second planarization layer 27, such as an acrylic resin, and the inorganic material that forms the first lens layer 31, such as SiN.

The magnitude of the membrane stress induced in the materials described above increases in the following order: an acrylic resin (second planarization layer 27), SiO, SiON, SiN (first lens layer 31). Corrugation occurs because the difference in membrane stress between the second planarization layer 27 (acrylic resin) and the first lens layer 31 (SiN) is large as described above. To address the problem, the buffer layer 28 made of SiO or SiON, in which stress of intermediate magnitude is induced, is formed between the two layers. A buffering effect provided by the layer in which stress of intermediate magnitude is induced suppresses corrugation along the interface between the two layers.

The magnitude of the membrane stress induced in an acrylic resin, a styrene resin, and a styrene-acryl copolymerization resin is as follows: acrylic resin<styrene-acryl copolymerization resin<styrene resin<SiO. A styrene resin and a styrene-acryl copolymerization resin are more similar to SiN, which forms the first lens layer 31, than an acrylic resin. Corrugation is therefore more unlikely to occur along the interface when a styrene resin or a styrene-acryl copolymerization resin as a second planarization layer 27, in which a greater amount of membrane stress is induced than in an acrylic resin, is used than when an acrylic resin is used.

Even when the first lens layer 31 is made of a metal-oxide-containing resin or corrugation is unlikely to occur along the interface between the first lens layer 31 and the second planarization layer 27, the buffer layer 28 described above can be provided as an antireflection layer.

Consider now a case where the second planarization layer 27 made of an acrylic resin, the buffer layer 28 made of SiON, and the first lens layer 31 made of SiN are formed over the color filters 26.

In the configuration described above, the magnitude of the refractive indices n of the layers is as follows: second planarization layer 27 (acrylic resin: n is about 1.5)<buffer layer 28 (SiON: n ranges from about 1.6 to 1.8)<first lens layer 31 (SiN: n ranges from about 1.85 to 2.0).

When the second planarization layer 27 is alternatively made of a styrene resin (n is about 1.6) or a styrene-acryl copolymerization resin (n ranges from about 1.55 to 1.58) as well, the magnitude of the refractive indices n of the layers is as follows: second planarization layer 27<buffer layer 28 (SiON)<first lens layer 31 (SiN).

The relationships of the magnitude of the refractive index described above indicate that when the buffer layer 28 is made of SiON, the reflectance decreases because the buffer layer 28 has an intermediate refractive index between those of the second planarization layer 27 and the first lens layer 31.

As described above, the buffer layer 28 can function as an antireflection layer by employing a configuration in which the buffer layer 28 has an intermediate refractive index between those of the second planarization layer 27 and the first lens layer 31. For example, even when the buffer layer 28 is made of SiO having a refractive index n of about 1.45, the buffer layer 28 can function as an antireflection layer by changing the materials, film formation conditions, and other factors of the second planarization layer 27 and the first lens layer 31 to adjust the refractive indices thereof.

Even when the first lens layer 31 is not made of SiN but is made of a metal-oxide-containing resin having a refractive index comparable with that of SiN, the reflectance can be reduced as described above.

When the second planarization layer 27 and the buffer layer 28, the latter of which is made of SiN or SiON, are formed over the color filters 26, the distance from the photodiodes 22 to the microlenses 30 in the solid-state imaging device 20 increases. The buffer layer 28, however, only needs to be about 5 nm in thickness to provide the buffering effect. Further, the second planarization layer 27 can be formed to be thin when a selected acrylic resin has thermal fluidity, thermal curability, and thermal shrinkability. Therefore, even when the second planarization layer 27 and the buffer layer 28 are formed, and the distance from the photodiodes 22 to the microlenses 30 increases, the resultant decrease in the sensitivity of the solid-state imaging device does not cause a practical problem.

Figure 3:
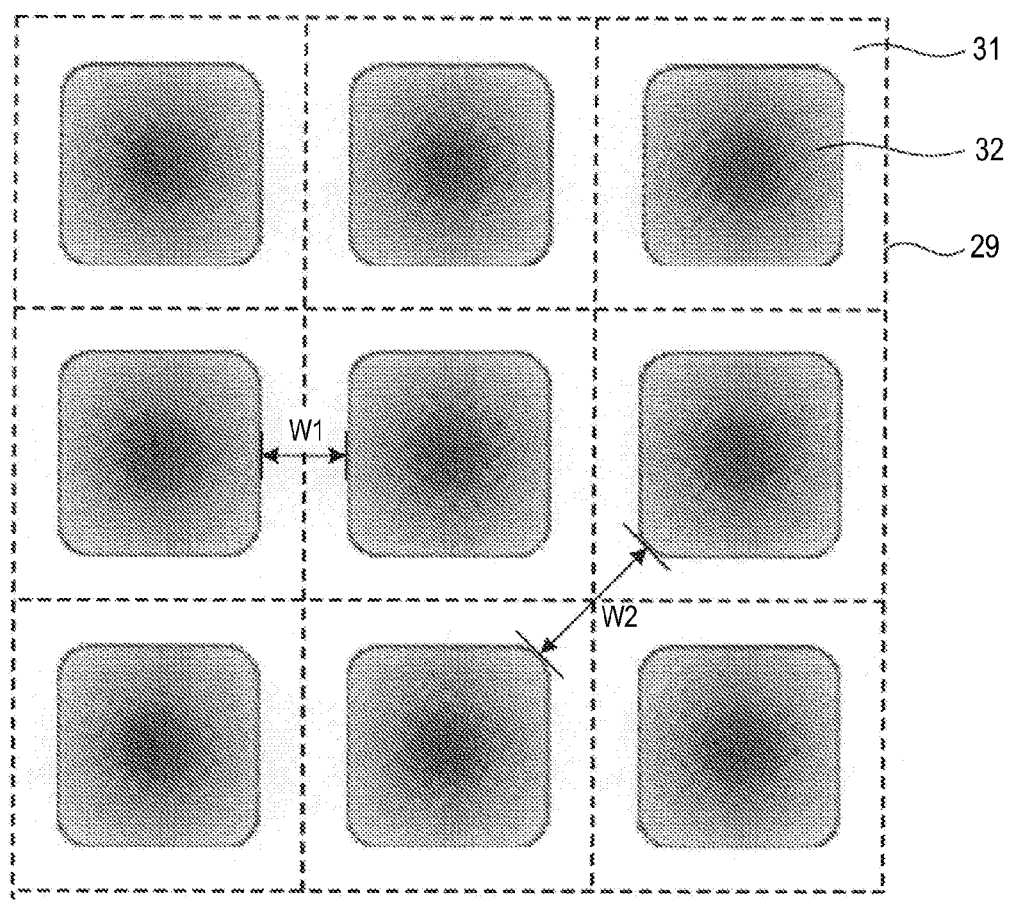
FIG. 3 is a plan view showing the configuration of a first lens layer in the solid-state imaging device.

FIG. 3 is a plan view showing the first lens layer 31 formed on the buffer layer 28.

The broken lines shown in FIG. 3 represent the unit pixels 29 in the solid-state imaging device 20. The microlenses 30 formed in correspondence with the unit pixels 29 are preferably so formed that each of the microlenses 30 has the same size as that of the corresponding unit pixel 29 in the plan view. Further, the first lens layer 31 is so formed that it covers the entire unit pixels 29.

The first microlenses 32 formed based on the first lens layer 31 are so formed that adjacent first microlenses 32 have a gap in at least one of the direction parallel to horizontally or vertically adjacent pixels (W1) and the direction parallel to diagonally adjacent pixels (W2), as shown in FIG. 3.

To improve the sensitivity characteristics of the solid-state imaging device 20, the gaps between adjacent pixels in the directions W1 and W2 described above and the distance from the photodiodes 22 to the microlenses 30 are preferably minimized. Further, when the microlenses 30 are formed in a dry etching process, it is necessary to minimize the etching process period. The reason for this is that dark current in the solid-state imaging device 20 can be suppressed by minimizing plasma damage to the semiconductor base substrate 21.

A typical solid-state imaging device of related art has square unit pixels 29, as shown in FIG. 3 described above. In this configuration, even when the first microlenses 32 are formed, for example, with no gap in the direction W1, the gaps in the direction W2, each of which is inherently large, still remain. When the microlenses 30 are formed, for example, in a dry etching process, it is conceivable that the gaps in the direction W2 are eliminated by performing the etching in a condition that reduces the length of the gaps in the direction W2. When the dry etching is performed in a condition that eliminates the gaps in the direction W2, however, the dry etching period increases, resulting in degradation in dark current characteristics of the solid-state imaging device 20. Further, when the processing period increases, wafer-to-wafer etching variation increases. As a result, the cross-sectional shape of the microlenses 30 varies, which adversely affects the sensitivity characteristics of the solid-state imaging device 20.

In contrast, in the solid-state imaging device 20 according to the present embodiment, the microlenses 30 are formed by stacking the first lens layer 31 and the second lens layer 33.

Now, define the thickness of the second lens layer 33 formed on the first lens layer 31 as follows: Let Tt be the thickness of the second lens layer 33 formed at a central portion of each of the first microlenses 32, and let Tb be the thickness of the second lens layer 33 formed at the periphery of the first microlens 32, as shown in FIGS. 4A to 4D. The thus defined Tt and Tb satisfy the following relationship: $0 \leq Tt \leq Tb$, which represents a configuration in which the second lens layer 33 is present at the periphery of each of the first microlenses 32 and the second lens layer 33 whose thickness is smaller than that of the second lens layer 33 present in the periphery is also present at the central portion of the first microlens 32 or no second lens layer 33 is present at the central portion of the first microlenses 32.

In the thus configured solid-state imaging device 20, the first microlenses 32 are so formed that adjacent ones have a gap w in at least one of the direction parallel to horizontally or vertically adjacent pixels (W1) and the direction parallel to diagonally adjacent pixels (W2), as shown in FIG. 3 described above. In the condition that allows the gap w to be formed, the dry etching period can be shortened, whereby the increase in dark current in the solid-state imaging device 20 is suppressed.

Further, the microlenses 30 are so formed that the second lens layer 33 enlarges the area of each of the first microlenses 32 in the plan view. As a result, the ability of each of the microlenses 30 to collect light can be improved, whereby the sensitivity and shading characteristics of the solid-state imaging device 20 can be improved.

The second lens layer 33 is made of at least one of the materials selected from SiON, SiN, SiO, and SiOC (having refractive index of about 1.4). When the second lens layer 33 is made of SiO or SiOC, which has a refractive index lower than those of SiON and SiN, one of which forms the first lens layer 31, the second lens layer 33 also functions as an antireflection layer on the microlenses 30.

FIGS. 4A to 4D show configurations that satisfy the relationship between Tt and Tb described above, $0 \leq Tt \leq Tb$, in the first lens layer 31 and the second lens layer 33, which form the microlenses 30.

Microlenses 30A to 30D shown in FIGS. 4A to 4D correspond to states in which second lens layers 33 having different thicknesses are formed on the first microlenses 32. The microlenses 30A to 30D shown in FIGS. 4A to 4D are so configured that the first microlenses 32 are formed based on the first lens layer 31 in a known method of related art and the second lens layer 33 is then so formed on the first lens microlenses 32 that the thickness of the second lens layer 33 is adjusted in a dry etching process. The method for forming the first lens layer 31 and the second lens layer 33 will be described in detail in the description of a method for manufacturing the solid-state imaging device, which will be described later.

Figure 4A:
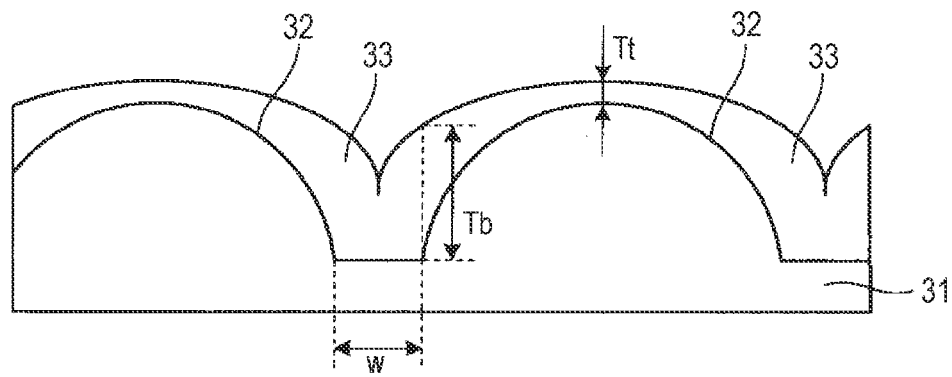
FIGS. 4A to 4D show various configurations of microlenses in the solid-state imaging device according to the embodiment.

In the microlenses 30A shown in FIG. 4A, the second lens layer 33 is formed over the entire surface of the first lens layer 31. The relationship between the thickness Tt of the second lens layer 33 at the central portion of each of the first microlenses 32 and the thickness Tb of the second lens layer 33 at the periphery of the first microlens 32 is Tt<Tb.

Further, the second lens layer 33 is so configured that it is thinnest at the central portion of each of the first microlenses 32 and gradually becomes thicker with the distance from the central portion toward the periphery.

In the configuration described above, the second lens layer 33 fills the inter-pixel gap w between the first microlenses 32, whereby the resultant microlenses 30A have no inter-pixel gap w. The area of each of the microlenses 30A in a plan view can therefore be enlarged, whereby the ability of the microlens 30A to collect light can be improved and the sensitivity characteristics of the solid-state imaging device 20 can be improved accordingly.

Figure 4B:
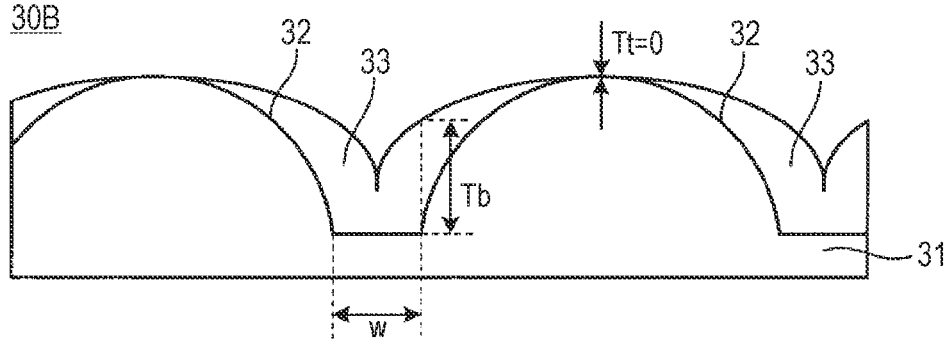

In the microlenses 30B shown in FIG. 4B, the second lens layer 33 is formed over the entire surface of the first lens layer 31 except the central portion of each of the first microlenses 32. The configuration corresponds to a state in which the etching is terminated when Tt becomes zero in the formation of the second lens layer 33. The thus configured microlenses 30B are formed based on the microlenses 30A in the state shown in FIG. 4A by further etching the second lens layer 33.

The second lens layer 33 is not present at the central portion of each of the first microlenses 32 but is present at the periphery of the first microlens 32. That is, the second lens layer 33 is formed based on the relationship of 0=Tt<Tb.

In the configuration described above, the second lens layer 33 formed at the periphery of each of the first microlenses 32 fills the inter-pixel gap w. The resultant microlenses 30B have no inter-pixel gap w. The configuration described above allows the area of each of the microlenses 30B in a plan view to be enlarged, whereby the ability of the microlens 30B to collect light can be improved and the sensitivity characteristics of the solid-state imaging device 20 can be improved accordingly.

Figure 4C:
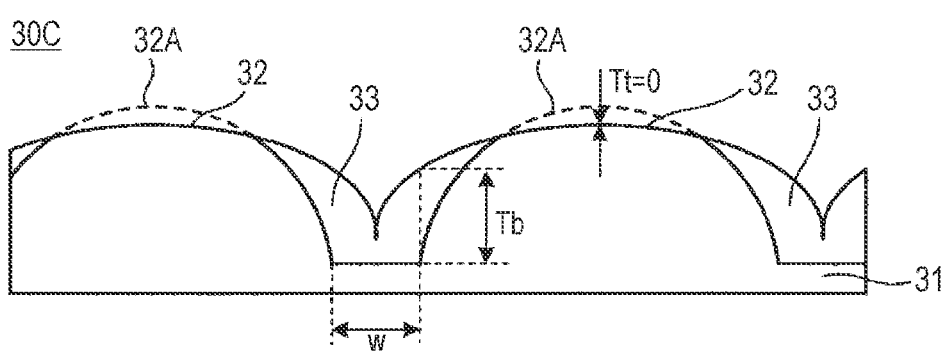

The microlenses 30C shown in FIG. 4C correspond to a state in which the second lens layer 33 is further etched from the microlenses 30B in the state shown in FIG. 4B.

In the microlenses 30C, the second lens layer 33 is formed over the entire surface of the first lens layer 31 except a central portion of each of the first microlenses 32. The central portion of each of the first microlenses 32 and therearound is etched along with the second lens layer 33 by further etching the second lens layer 33. In FIG. 4C, the broken lines 32A each represent the portion of the lens surface of the central portion of the first microlens 32 before etched.

The configuration shown in FIG. 4C is achieved by further etching the second lens layer 33 from the state in which the central portion of each of the first microlenses 32 is exposed to a state in which the first microlens 32 exposed through the second lens layer 33 is etched. As described above, each of the etched regions of the first lens layer 31 is enlarged in the direction from the central portion of the corresponding first microlens 32 toward the periphery thereof by further etching the second lens layer 33.

In the configuration of the microlenses 30C shown in FIG. 4C as well, the second lens layer 33 is not present at the central portion of each of the first microlenses 32 but is present at the periphery of the first microlens 32. That is, the second lens layer 33 is formed based on the relationship 0=Tt<Tb. The second lens layer 33 at the periphery of each of the first microlenses 32 fills the inter-pixel gap w. The resultant microlenses 30C have no inter-pixel gap w.

As shown in FIG. 4C, even in the configuration in which no second lens layer 33 is formed at the central portion of each of the first microlenses 32 and therearound, the area of each of the microlenses 30C in a plan view can be enlarged because the second lens layer 33 fills the inter-pixel gap w.

Further, even in the configuration in which the central portion of each of the first microlenses 32 is etched, the second lens layer 33 forms a series of lens surfaces formed of the first microlenses 32 and the second lens layer 33.

The configuration described above allows the ability of each of the microlenses 30 to collect light to be improved and the sensitivity characteristics of the solid-state imaging device 20 to be improved accordingly.

Figure 4D:
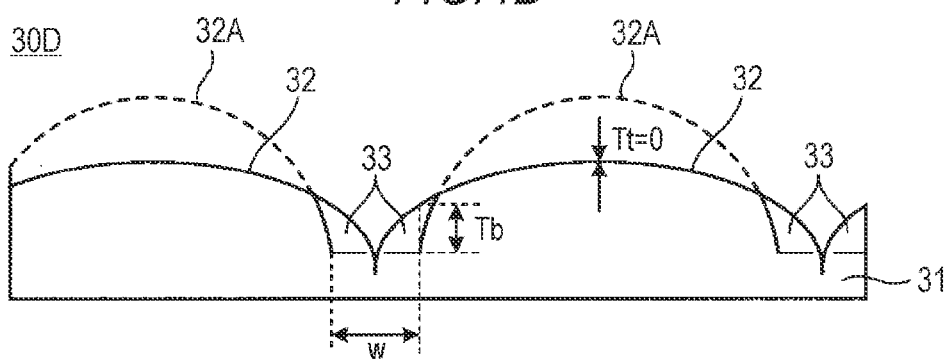

The microlenses 30D shown in FIG. 4D correspond to a state in which the first lens layer 31 and the second lens layer 33 are further etched from the microlenses 30C in the state of shown in FIG. 4C. In FIG. 4D, the broken lines 32A each represent the portion of the lens surface of the first microlens 32 before etched.

In the microlenses 30D, the second lens layer 33 is formed only in the vicinity of the periphery of each of the first microlenses 32 and in the inter-pixel gap w therearound. The etched region of each of the first microlenses 32 is enlarged in the direction from the center toward the periphery and is larger than the etched region in the configuration shown in FIG. 4C described above. Further, a central portion of each of the inter-pixel gaps w of the first lens layer 31 is etched away, as a central portion of each of the first microlenses 32 is. That is, the second lens layer 33 is completely etched away at the central portion of each of the inter-pixel gaps w, and the first lens layer 31 exposed through the second lens layer 33 at the central portion of the inter-pixel gap w is also etched.

In the configuration of the microlenses 30D shown in FIG. 4D, the second lens layer 33 is not present at the central portion of each of the first microlenses 32 or the central portion of each of the inter-pixel gaps w. The second lens layer 33 having the thickness Tb is, however, present at the periphery of each of the first microlenses 32. That is, the second lens layer 33 is formed based on the relationship 0=Tt<Tb.

Further, the surface formed by etching the first lens layer 31 at the central portion of each of the inter-pixel gaps w is connected to the surface of the second lens layer 33 and the lens surface of the adjacent first microlens 32, whereby a series of lens surfaces that form the microlenses 30D is formed.

As a result, the first microlenses 32, the second lens layer 33 at the peripheries of the first microlenses 32, and the etched surfaces of the inter-pixel gaps w of the first lens layer 31 form the microlenses 30D with no inter-pixel gap w.

As described above, even in the configuration in which the first lens layer 31 formed in the inter-pixel gaps w is also etched, the second lens layer 33 formed at the periphery of each of the first microlenses 32 fills the inter-pixel gap w around the first microlens 32. As a result, the area of each of the microlenses 30D in a plan view is enlarged, whereby the ability of the microlens 30 to collect light can be improved and the sensitivity characteristics of the solid-state imaging device 20 can be improved accordingly.

The configuration of the microlenses 30D shown in FIG. 4D may be further so etched that the bottom of the first lens layer 31 in each of the inter-pixel gaps w is penetrated to the second planarization layer 27. In this configuration as well, as long as the second lens layer 33 having the thickness Tb is present at the periphery of each of the first microlenses 32, the first microlenses 32, the second lens layer 33, and the first lens layer 31 in the inter-pixel gaps w forma series of lens surfaces, whereby the area of each of the microlenses 30D in a plan view can be enlarged.

[Variations]

Figure 5A:
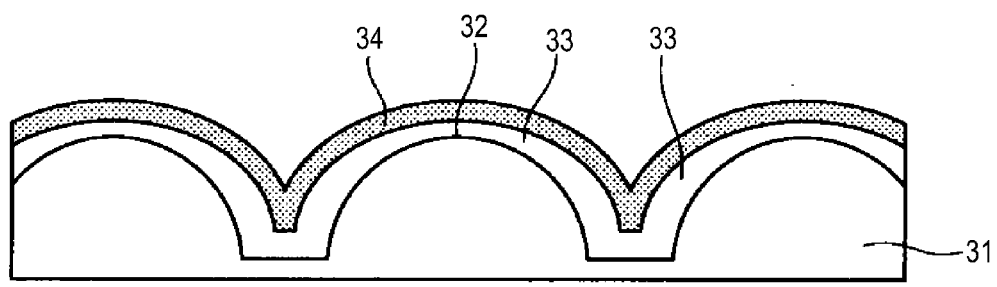
FIGS. 5A to 5C show configurations of variations of the microlenses in the solid-state imaging device.
Figure 5B:
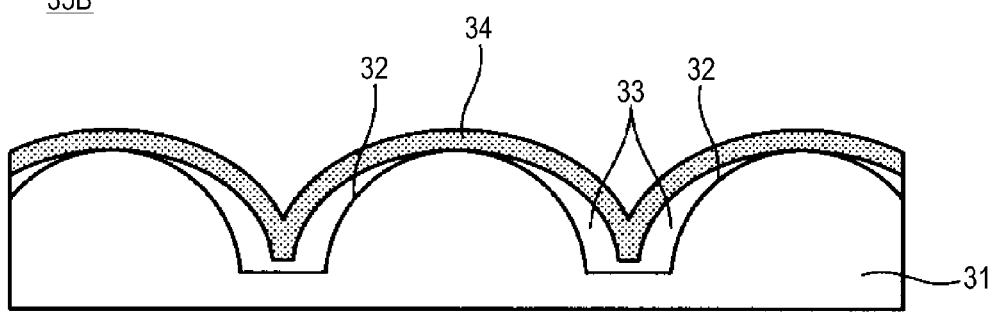
Figure 5C:
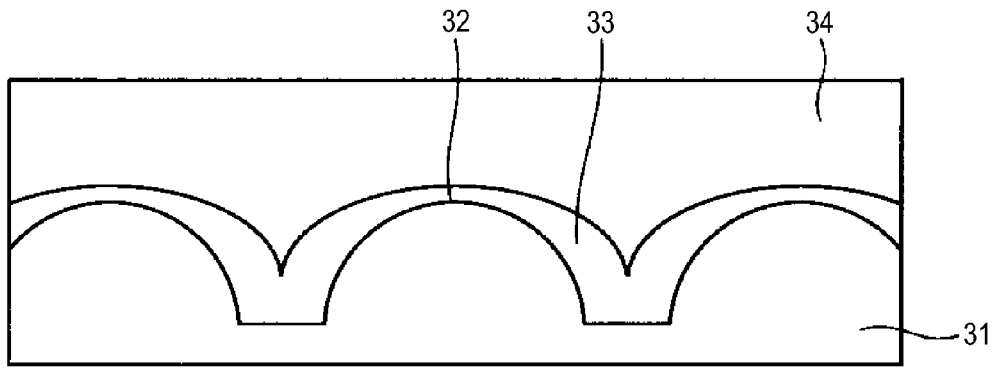

Variations of the microlenses in the solid-state imaging device described above will next be described. FIGS. 5A to 5C show the configurations of microlenses 35 of the variations. The components other than the microlenses are the same as those in the embodiment described above and will therefore not be illustrated or described.

The microlenses 35 shown in FIGS. 5A to 5C each include a third lens layer 34 over the first lens layer 31 and the second lens layer 33.

The configuration of microlenses 35A shown in FIG. 5A corresponds to the configuration of the microlenses 30A shown in FIG. 4A described above, and the configuration of microlenses 35B shown in FIG. 5B corresponds to the configuration of the microlenses 30B shown in FIG. 4B described above.

In the microlenses 35A shown in FIG. 5A, the third lens layer 34 is formed over the entire surface of the second lens layer 33.

In the microlenses 35B shown in FIG. 5B, the third lens layer 34 is so formed that is covers a central portion of each of the first microlenses 32 and the second lens layer 33.

The third lens layer 34 is formed to a substantially uniform thickness along the upper surface of the second lens layer 33 both in the microlenses 35A and the microlenses 35B.

In the microlenses 35C shown in FIG. 5C, the third lens layer 34 is provided over the first lens layer 31 and the second lens layer 33 and has a flat surface. The third lens layer 34 may thus have a flat surface.

Each of the third lens layers 34 shown in FIGS. 5A to 5C, when made of a material having a refractive index lower than that of the material that forms the first lens layer 31, functions as an antireflection layer on the surface of the microlenses 35.

Table 1 below shows the relationship of the refractive indices of the second lens layer 33 and the third lens layer 34 with the refractive index of the first lens layer 31 made of SiON or SiN.

TABLE 1

| | First lens layer | Second lens layer | Third lens layer |
|---|---|---|---|
| (1) | Refractive index = c | Comparable with c | Lower than c |
| (2) | Refractive index = c | Higher than c | Lower than c |

In Table 1, it is assumed that the first lens layer 31 has a refractive index c, and the second lens layer 33 is made of a material (1) having a refractive index comparable with the refractive index c of the first lens layer 31 or a material (2) having a refractive index higher than the refractive index c of the first lens layer 31. The third lens layer 34 is made of a material having a refractive index lower than the refractive index c of the first lens layer 31.

In the configuration shown in the row (1) in Table 1, the third lens layer 34 functions as a monolayer antireflection layer. To this end, the third lens layer 34 is made of SiO (refractive index of about 1.45) or SiOC (refractive index of about 1.4).

In the configuration shown in the row (2) in Table 1, the second lens layer 33 and the third lens layer 34 function as a two-layer antireflection layer. To this end, the third lens layer 34 is made of SiO or SiOC, as in the configuration (1) described above.

For example, when the first lens layer 31 is made of SiON, the second lens layer 33 is made of SiON having the same refractive index as the refractive index of SiON, which forms the first lens layer 31, or SiN having a refractive index higher than the refractive index of SiON, which forms the first lens layer 31. The third lens layer 34 is made of SiOC or SiO having a refractive index lower than the refractive index of SiON, which forms the first lens layer 31.

When the first lens layer 31 is made of SiN, the second lens layer 33 is made of SiN having the same refractive index as the refractive index of SiN, which forms the first lens layer 31. The third lens layer 34 is made of SiOC or SiO having a refractive index lower than the refractive index of SiN, which forms the first lens layer 31.

The refractive index of the material that forms each of the lens layers is determined by a variety of film formation conditions in a P-CVD process (plasma CVD, plasma-enhanced chemical vapor deposition), such as the temperature, the pressure, the type of gas, and the flow rate of the gas. The refractive indices of the first lens layer 31 and the second lens layer 33 are adjusted to be higher than the refractive index of a typical microlens resin material (ranging from about 1.5 to 1.6) in order to improve the ability of the microlenses 30 to collect light.

When the second lens layer 33 and the third lens layer 34 function as a two-layer antireflection layer, the second lens layer 33 is made of a high refractive index material, and the third lens layer 34 is made of a low refractive index material. The high refractive index material that forms the second lens layer 33 is a material having a refractive index higher than the refractive index of SiN, such as a zirconium oxide (ZrO having a refractive index n of 2.4) or a titanium oxide (TiO having a refractive index n of 2.52). The low refractive index material that forms the third lens layer 34 is a material having a refractive index lower than the refractive index of SiOC, such as a magnesium fluoride ($MgF_2$ having a refractive index n of 1.37). Each of the second lens layer 33 and the third lens layer 34 is formed to a thickness of $1.0/4\lambda$, where $\lambda$ represents the wavelength of desired light to be reflected.

<2. Method for Manufacturing Solid-State Imaging Device>

A description will next be made of a method for manufacturing the solid-state imaging device according to the embodiment described above. In the following description, only the components located above the color filters in the solid-state imaging device are shown, and the other components are omitted. The components located below the color filters can be manufactured by using a method for manufacturing a solid-state imaging device known in related art. Further, the solid-state imaging device described below has a configuration in which no buffer layer is provided between the second planarization layer and the first lens layer.

Figure 6A:
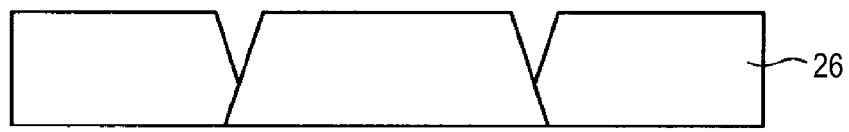
FIGS. 6A to 6D are manufacturing step diagrams showing an embodiment of a method for manufacturing the solid-state imaging device.

First, the color filters 26 to be formed in correspondence with the pixels of the solid-state imaging device are formed, as shown in FIG. 6A. The color filters 26 are formed by using a coloring agent, for example, a pigment or a photosensitive resin into which a pigment is added, in a photolithography process. The color filters 26 are made of RED, GREEN, BLUE, YELLOW, CYAN, and MAGENTA and other color materials.

Figure 6B:
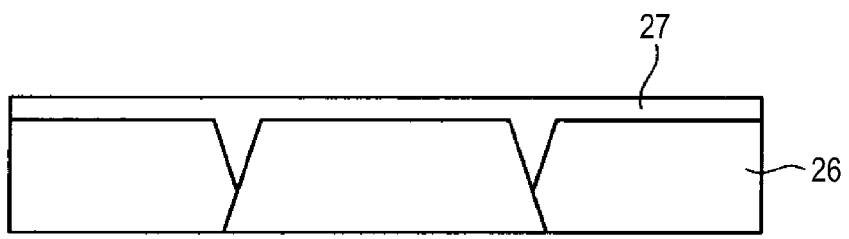

The second planarization layer 27 is then formed on the color filters 26, as shown in FIG. 6B. The second planarization layer 27 is made of a material that has thermal fluidity and thermal curability and forms a cured layer when a thermal treatment is finished, such as an acrylic resin, a styrene resin, and a styrene-acryl copolymerizing resin. A method for forming the second planarization layer 27 will be described later in detail.

Figure 6C:
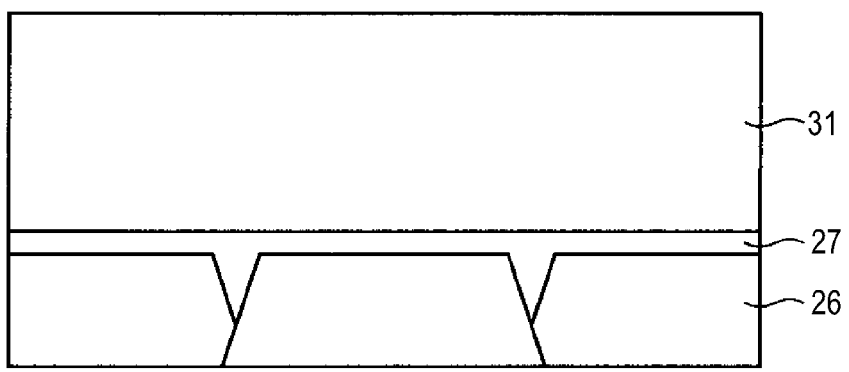

The first lens layer 31 made, for example, of SiN is then formed on the second planarization layer 27, as shown in FIG. 6C. The first lens layer 31 is formed to be sufficiently thicker than the first microlenses 32 to be formed. The first lens layer 31 is formed, for example, in a P-CVD process using $SiH_4$, $NH_3$, and $N_2$ as film formation gases. The pressure and other parameters are adjusted as appropriate at a temperature of about 200° C. in the P-CVD formation process.

Figure 6D:
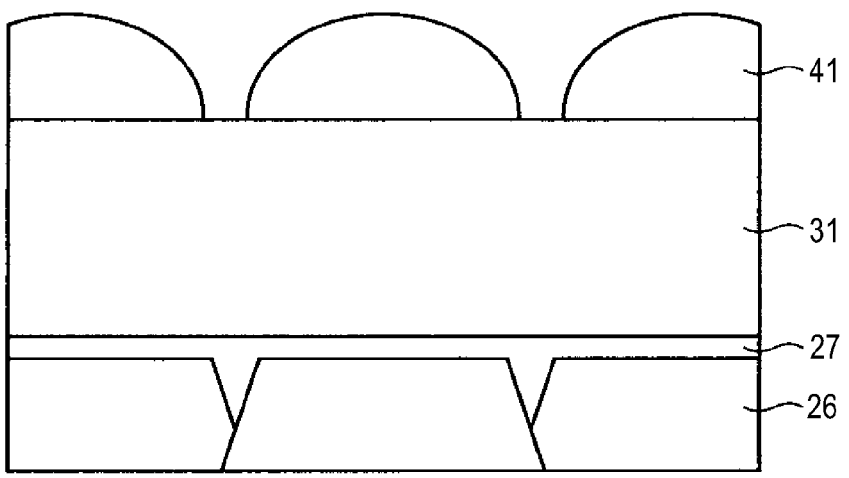

A positive photosensitive resin 41 is formed on the first lens layer 31 and patterned in correspondence with the pixels of the solid-state imaging device 20, as shown in FIG. 6D. Examples of the positive photosensitive resin 41 include a novolac resin, a styrene-based resin, and a copolymerizing resin formed thereof. The photosensitive resin 41 is formed and patterned, for example, by performing the following processes: spin application; pre-baking; i-line light exposure; post-exposure baking, development, and post-baking processing in this order. In the post-baking processing, the photosensitive resin 41 having the lens shape shown in FIG. 6D is formed.

Figure 7E:
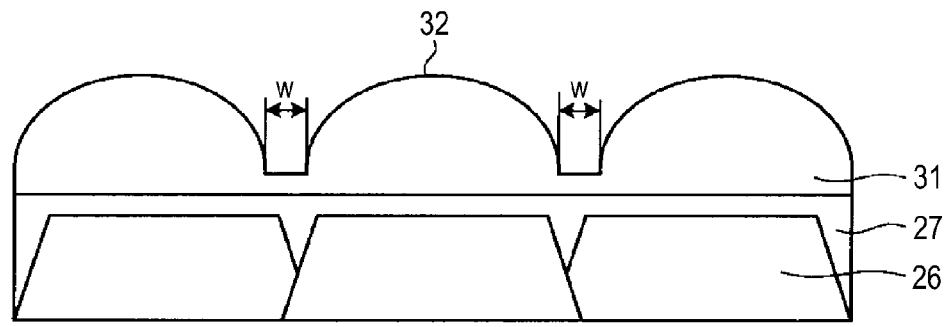
FIGS. 7E to 7H are other manufacturing step diagrams showing the embodiment of a method for manufacturing the solid-state imaging device.

The positive photosensitive resin 41 described above is then used as a mask to transfer the lens shape made of the photosensitive resin 41 to the first lens layer 31 in an etching process. The first microlenses 32 are thus formed, as shown in FIG. 7E. The first lens layer 31 is etched, for example, by using an ICP (inductively coupled plasma) apparatus, a CCP (capacitively coupled plasma) apparatus, a TCP (transformer coupled plasma) apparatus, a magnetron RIE (reactive ion etching) apparatus, an ECR (electron cyclotron resonance) apparatus, or any other suitable plasma generating apparatus. The temperature, the pressure, and other parameters are then adjusted as appropriate, and an etching gas primarily made of $CF_4$, $C_4F_8$, or any other fluoro-carbon-based gas is used.

A plan view of the first lens layer 31 to which the lens shape shown in FIG. 7E has been transferred shows that the inter-pixel gaps w are present in at least one of the directions W1 and W2 associated with the first microlenses 32, as shown in FIG. 3 described above. The etching can be finished in a short period by forming the first lens layer 31 in a condition that allows the inter-pixel gaps w to be present as described above. Since the dry etching period can be shortened, an increase in dark current in the solid-state imaging device 20 due to plasma damage can be suppressed.

Figure 7F:
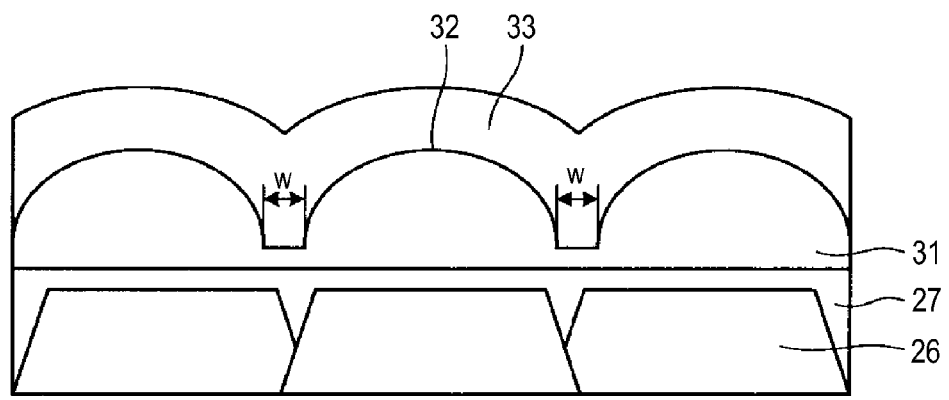

The second lens layer 33 is then formed on the first lens layer 31, as shown in FIG. 7F. The second lens layer 33 formed on the first microlenses 32 follows the shape of the lens surfaces of the first microlenses 32. Further, the second lens layer 33 formed on the inter-pixel gaps w is thicker than the second lens layer 33 formed on the first microlenses 32.

The second lens layer 33 is made, for example, of SiN and formed in a P-CVD process by using $SiH_4$, $NH_3$, and $N_2$ as gases for forming an SiN film. The pressure and other parameters are adjusted as appropriate at a temperature of about 200° C. in the P-CVD formation process.

Figure 7G:
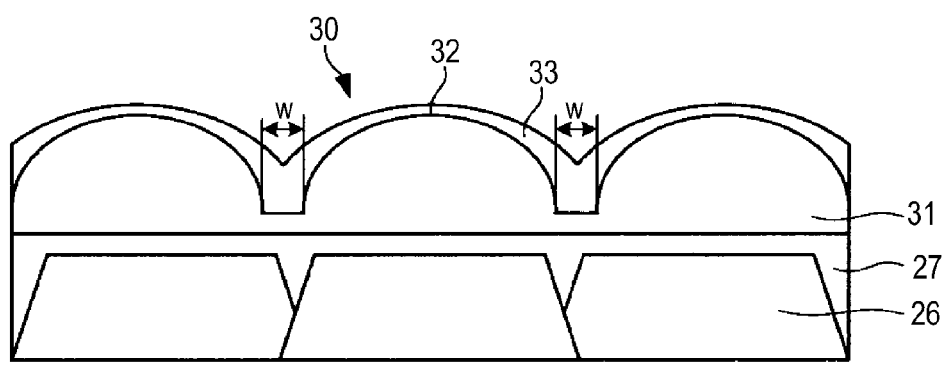
Figure 7H:
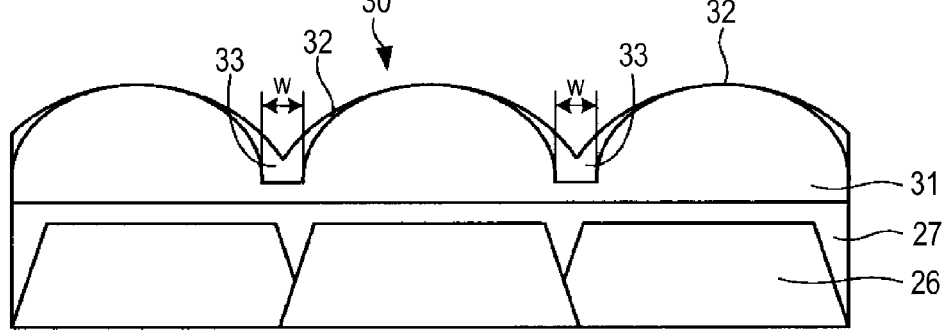

The thus formed second lens layer 33 is then etched to form the second lens layer 33 having the configuration shown in FIG. 7G or 7H.

FIG. 7G corresponds to the configuration of the microlenses 30A shown in FIG. 4A described above, in which the second lens layer 33 is formed over the entire surface of the first lens layer 31. The second lens layer 33 is thinnest at the central portion of each of the first microlenses 32, and the layer thickness gradually increases from the central portion toward the periphery.

The second lens layer 33 fills the inter-pixel gaps w between the first microlenses 32. The microlenses 30 are thus formed.

FIG. 7H corresponds to the configuration of the microlenses 30B shown in FIG. 4B described above, in which the second lens layer 33 is formed over the entire surface of the first lens layer 31 except the central portion of each of the first microlenses 32. The etching of the second lens layer 33 is terminated when the layer thickness at the central portion of each of the first microlenses 32 becomes zero.

As shown in FIGS. 7G and 7H, the second lens layer 33 formed at the periphery of each of the first microlenses 32 fills the inter-pixel gap w, and the resultant microlenses 30 have no inter-pixel gap w.

Although not shown, the configuration of the microlenses 30C shown in FIG. 4C described above and the configuration of the microlenses 30D shown in FIG. 4D described above can also be achieved by changing the etching conditions as appropriate.

The solid-state imaging device 20 including the microlenses 30 shown in FIG. 2 described above can be manufactured by carrying out the steps described above.

According to the manufacturing method described above, the first microlenses 32 are formed with the inter-pixel gaps w present in at least one of the direction parallel to horizontally or vertically adjacent pixels (W1) and the direction parallel to diagonally adjacent pixels (W2). In the condition that allows the inter-pixel gaps w to be formed, the dry etching period can be shortened, whereby an increase in dark current in the solid-state imaging device 20 is suppressed. Further, the second lens layer 33 fills the inter-pixel gaps w and the resultant microlenses 30 have no inter-pixel gap w, whereby the area of each of the microlenses 30 in a plan view is enlarged and the ability of the microlens 30 to collect light is improved accordingly. As a result, the sensitivity and shading characteristics of the solid-state imaging device 20 can be improved.

[Method for Forming Second Planarization Layer]

A description will be made of a method for forming the second planarization layer 27 formed on the color filters 26 in the method for manufacturing the solid-state imaging device described above.

To increase the sensitivity of the solid-state imaging device 20, it is preferable to shorten the distance between the microlenses 30 and the photodiodes 22. To this end, each of the layers on the semiconductor base substrate 21 shown in FIG. 2 described above is desirably formed to be thin. The second planarization layer 27, when formed, is also desirably formed to be thin.

To reduce the thickness of the second planarization layer 27, the second planarization layer 27 is made of a material that has thermal fluidity and thermal curability and forms a cured layer when a thermal treatment is finished, such as an acrylic resin, a styrene resin, and a styrene-acryl copolymerizing resin.

Figure 8A:
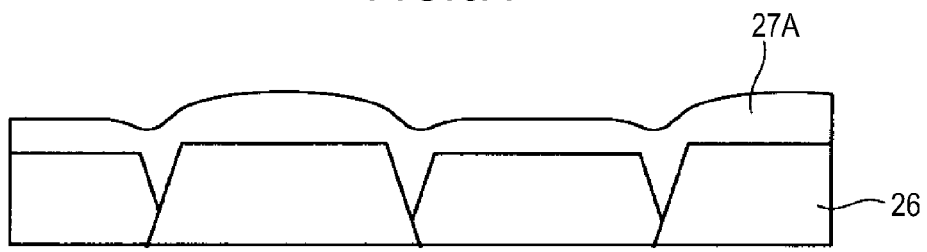
FIGS. 8A to 8C show steps of forming a second planarization layer in the solid-state imaging device.
Figure 8B:
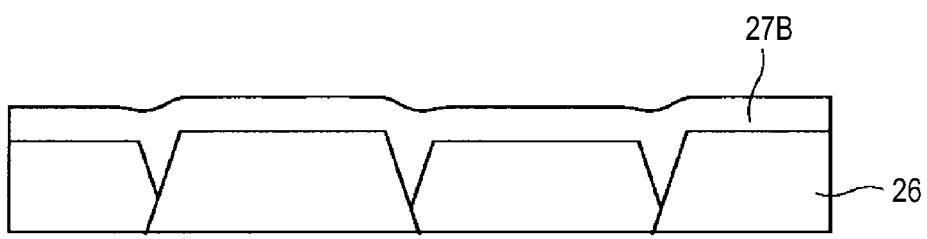
Figure 8C:
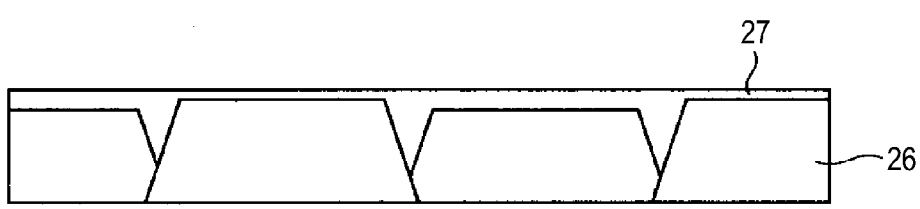

FIGS. 8A to 8C show steps of forming the second planarization layer 27 with a resin having the characteristics described above.

First, a resin is applied onto the color filters 26 in a spin application process to form a second planarization layer 27A, as shown in FIG. 8A. The second planarization layer 27A immediately after the application has irregularities in the surface because affected by the protrusions and recesses in the surfaces of the color filters 26 having different thicknesses for different colors.

The second planarization layer 27A in the state shown in FIG. 8A is then heat treated. Since the resin that forms the second planarization layer 27A has thermal fluidity and thermal curability as described above, the heat treatment increases the fluidity of the second planarization layer 27A, which therefore moves in such a way that the surface thereof is planarized. As a result, a second planarization layer 27B having recesses shallower than those before the protrusions and recesses undergo the heat treatment is formed, as shown in FIG. 8B.

FIG. 8C shows the second planarization layer 27 cured by the heat treatment described above. The heat treatment also increases thermal curability of the second planarization layer 27 as well as the thermal fluidity thereof. The second planarization layer 27 further experiences thermal shrinkage in the heat treatment. The volume of the second planarization layer 27 therefore decreases from that before cure to that after cure because the second planarization layer 27 shrinks when it thermally cures. As a result, the cured second planarization layer 27 is thinner than the second planarization layer 27 before cure. The increase in fluidity resulting from the heat treatment further planarizes the surface of the second planarization layer 27.

Therefore, forming the second planarization layer 27 with a material that has thermal fluidity and thermal curability and forms a cured layer when a thermal treatment is finished reduces the amount of irregularities produced immediately after the spin application, whereby a substantially flat, thin, thermally cured layer can be formed.

Further, the second planarization layer 27, which is made, for example, of an acrylic resin, a styrene resin, or a styrene-acryl copolymerizing resin, which experiences increases in thermal fluidity and thermally curability at the same time, can be formed to be further thinner by reducing the molecular weight of the resin to increase the amount of thermal shrinkage. The thus formed thin second planarization layer 27 reduces the distance between the photodiodes 22 and the microlenses 30, whereby the sensitivity characteristics of the solid-state imaging device 20 are improved.

[Etching Transfer to First Lens Layer]

A description will be made of the step of transferring the lens shape made of the photosensitive resin 41 to the first lens layer 31 shown in FIGS. 6D and 7E in the method for manufacturing the solid-state imaging device described above.

The etching transfer described above is preferably performed in a condition that allows the material of the first lens layer 31 to be etched at the same speed as the photosensitive resin 41 formed on the first lens layer 31 is etched.

Figure 9:
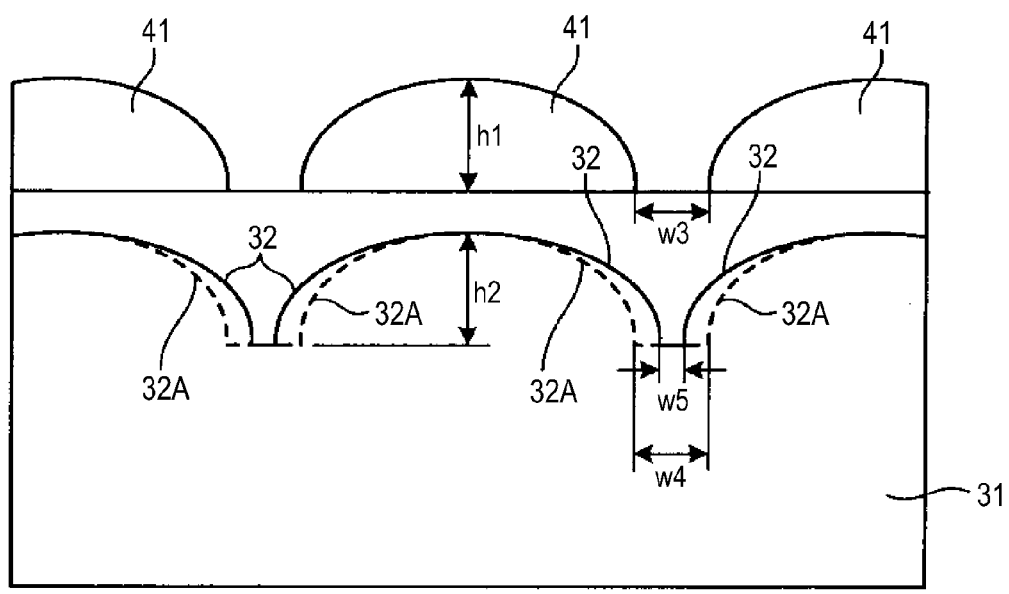
FIG. 9 describes the step of forming first microlenses in the solid-state imaging device according to the embodiment.

FIG. 9 shows not only a state in which the photosensitive resin 41 having the microlens shape is formed on the first lens layer 31 but also the shape of the first microlenses 32 transferred to the first lens layer 31 in the etching transfer process. In FIG. 9, h1 represents the height (thickness) of the central portion of the lens shape made of the photosensitive resin 41 and w3 represents the inter-pixel gap of the lens shape. Further, h2 represents the height (thickness) of the central portion of each of the first microlenses 32, and w4 and w5 represent the inter-pixel gap between the first microlenses 32.

When the first lens layer 31 is made of SiN, the etching is performed in a condition that allows (speed at which SiN is etched):(speed at which photosensitive resin 41 is etched) to be 1:1. The shape of the first microlenses 32 formed in this process is indicated by the broken line 32A in FIG. 9. When the ratio of the etching speed between the first lens layer 31 and the photosensitive resin 41 is 1:1, the shape of the first microlenses 32 after the etching is substantially the same as the shape of the photosensitive resin 41. As a result, the central portion of each of the first microlenses 32 is formed to a height h2 equal to the height h1 of the photosensitive resin 41. The first microlenses 32 are also formed to have an inter-pixel gap w4 equal to the inter-pixel gap w3 of the photosensitive resin 41.

Further, when a gas having strong etching deposition, such as $C_4F_8$, is used in the etching transfer process described above, the speed at which the first lens layer 31 is etched decreases because the ratio of the etching speed between the first lens layer 31 and the photosensitive resin 41 is shifted from 1:1. The solid line in FIG. 9 represents the shape of the first microlenses 32 formed under the condition described above.

When the first microlenses 32 are etched to the height h2 under the condition described above, the inter-pixel gap w5 is smaller than that achieved when the etching ratio is 1:1. That is, the inter-pixel gap w5 between the first microlenses and the inter-pixel gap w3 associated with the photosensitive resin 41 satisfy the relationship of w3>w5.

Since the inter-pixel gap w5 between the first microlenses 32 is small, the second lens layer formed on the first lens layer 31 can be thinner but can still fill the inter-pixel gap w5.

Further, when the speed at which the first lens layer 31 is etched relatively decreases, the etching process period increases, which raises a concern about an increase in plasma damage to the solid-state imaging device 20. To reduced the plasma damage, it is necessary to increase the etching speed. In this case, the flow rate of the $C_4F_8$ gas is reduced or a variety of etching conditions are so adjusted that the speed at which the first lens layer 31 is etched is greater than the speed at which the photosensitive resin 41 is etched with a gas type of $C_4F_8$ still used. As a result, degradation in dark current characteristics due to plasma damage to the solid-state imaging device 20 and a decrease in productivity thereof can be suppressed.

A description will further be made of a case where the etching is performed in a condition that allows the speed at which the first lens layer 31 is etched to be relatively so increased that the relationship among the widths w3, w4, and w5 is changed from w3>w4 (w5) to w3<w4 (w5). When the etching is performed in the condition that allows the gap associated with the first lens layer 31 increases, the etched first lens layer 31 may have an aspheric shape shown in FIG. 10 in some cases because the first lens layer 31 (for example, SiN) is etched at a high speed. In this case, each of the first microlenses 32 has a shape similar to a cone having a round vertex, and the inter-pixel gap w widens, resulting in an imperfect arcuate curved portion y.

Figure 10:
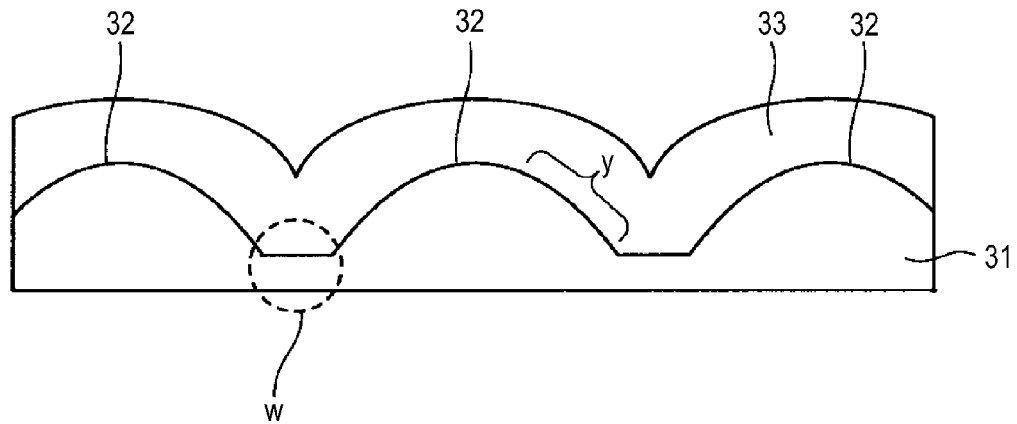
FIG. 10 describes the configuration of the microlenses in the solid-state imaging device according to the embodiment.

As described above, even when each of the first microlenses 32 is formed to have a conical shape, the second lens layer 33 is formed on the first lens layer 31 in the microlenses according to the present embodiment. As a result, even when each of the first microlenses 32 has an aspheric shape, the surface of each of the microlenses 30 can be so corrected by optimizing the lens shape of the second lens layer 33 that the aspheric shape approaches a spherical shape as shown in FIG. 10.

Therefore, even when there is a decrease in light collecting ability resulting from the shape of the first microlenses 32, the ability of the microlenses 30 to collect light can be improved by forming the second lens layer 33.

[Conditions Under which Second Lens Layer is Formed]

A description will be made of the relationship between the conditions under which the second lens layer 33 is formed and the curvature of the lens shape of the surface of the second lens layer 33 to be formed.

Figure 11A:
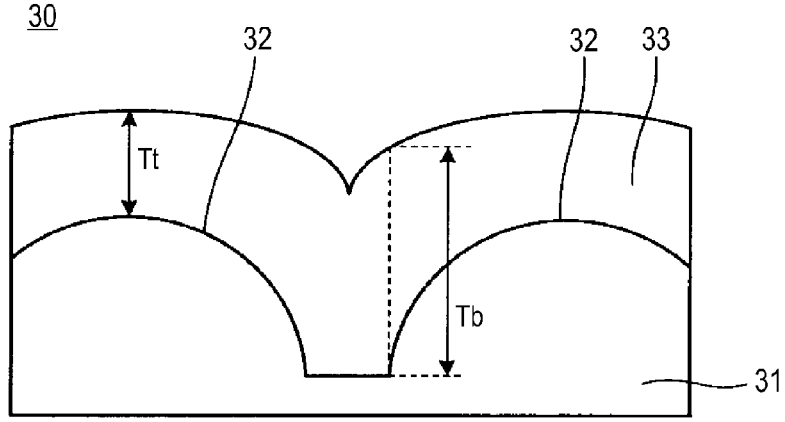
FIGS. 11A and 11B describe the configuration of the microlenses in the solid-state imaging device according to the embodiment.
Figure 11B:
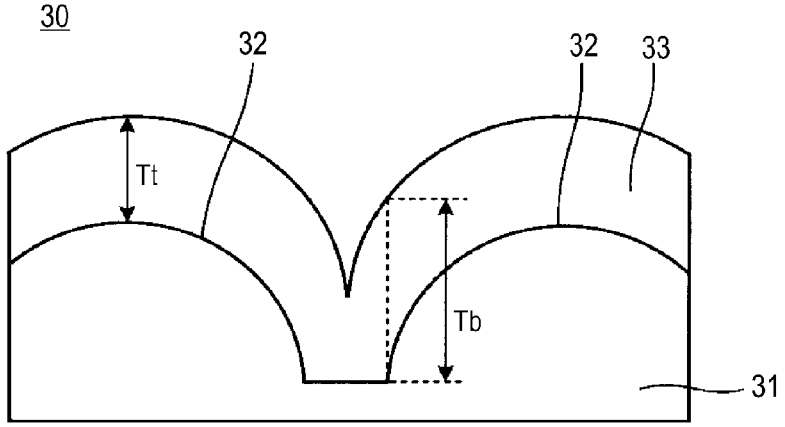

FIGS. 11A and 11B show a method for forming the second lens layer 33 with SiN or SiON, and a variety of specific conditions under which the mean free path is adjusted to adjust the curvature of the microlenses 30 in a P-CVD process are shown below.

(1) Silicon nitride (SiN)
   Gas: $SiH_4$, $NH_3$, $N_2$
   Temperature: about 200° C.
(2) Silicon oxynitride (SiON)
   Gas: $SiH_4$, $NH_3$, $N_2O$, $N_2$
   Temperature: about 200° C.

The pressure at the time of film formation is adjusted to be a value between about 2 mTorr to 10 Torr. The mean free path increases as the pressure decreases, whereas decreasing as the pressure increases. That is, the mean free path is long when the pressure is 2 mTorr, whereas being short when the pressure is 10 Torr.

FIG. 11A shows the configuration in a case where the second lens layer 33 is formed in a condition where the pressure at the time of film formation is low and hence the mean free path is long. On the other hand, FIG. 11B shows the configuration in a case where the second lens layer 33 is formed in a condition where the pressure at the time of film formation is high and hence the mean free path is short.

The curvature of the surface of the second lens layer 33 decreases when the mean free path is long, as shown in FIG. 11A. On the other hand, the curvature of the surface of the second lens layer 33 increases when the mean free path is short, as shown in FIG. 11B.

When the second lens layer 33 at a central portion of each of the first microlenses 32 has the same thickness Tt in both cases, the second lens layer 33 at the periphery of the first microlens 32 therefore has a large thickness Tb in FIG. 11A, in which the mean free path is long. On the other hand, the second lens layer 33 at the periphery of the first microlens 32 has a small thickness Tb in FIG. 11B, in which the mean free path is short.

The ratio between the thicknesses of the second lens layer 33 at the central portion and the periphery (Tt/Tb) is greater when the pressure at the time of film formation is high than when the pressure at the time of film formation is low.

As described above, a desired shape can be formed, for example, the microlenses 30 can be formed in desired positions in the solid-state imaging device 20 and the microlenses 30 can have desired curvature, by adjusting the conditions under which the second lens layer 33 is formed.

Further, even when the first lens layer 31 is formed to have an aspheric shape as shown in FIG. 10 described above, the aspheric shape can be corrected to a nearly spherical shape by adjusting the conditions under which the second lens layer 33 is formed as described above.

Although not described in the manufacturing method described above, the buffer layer 28 shown in FIG. 2 may be formed on the second planarization layer 27. In this case, the buffer layer 28 is made, for example, of SiO or SiON in a P-CVD process.

When the buffer layer 28 is made of SiO, $SiH_4$, $N_2O$, and other gases are used as the film formation gases. When the buffer layer 28 is made of SiON, $SiH_4$, $NH_3$, $N_2O$, $N_2$, and other gases are used as the film formation gases. The pressure and other parameters are adjusted as appropriate at a temperature of about 200° C. The temperature is determined also in consideration of color bleaching of the color filters 26 and the heat resistance of the organic material that forms the first planarization layer 25 and other layers.

The above embodiment has been described with reference to the case where the microlenses are used with a rear-illumination solid-state imaging device, but the microlenses described above can be used with a front-illumination CMOS solid-state imaging device and CCD solid-state imaging device.

<3. Electronic Apparatus>

A description will next be made of an embodiment of an electronic apparatus including the solid-state imaging device described above.

Figure 12:
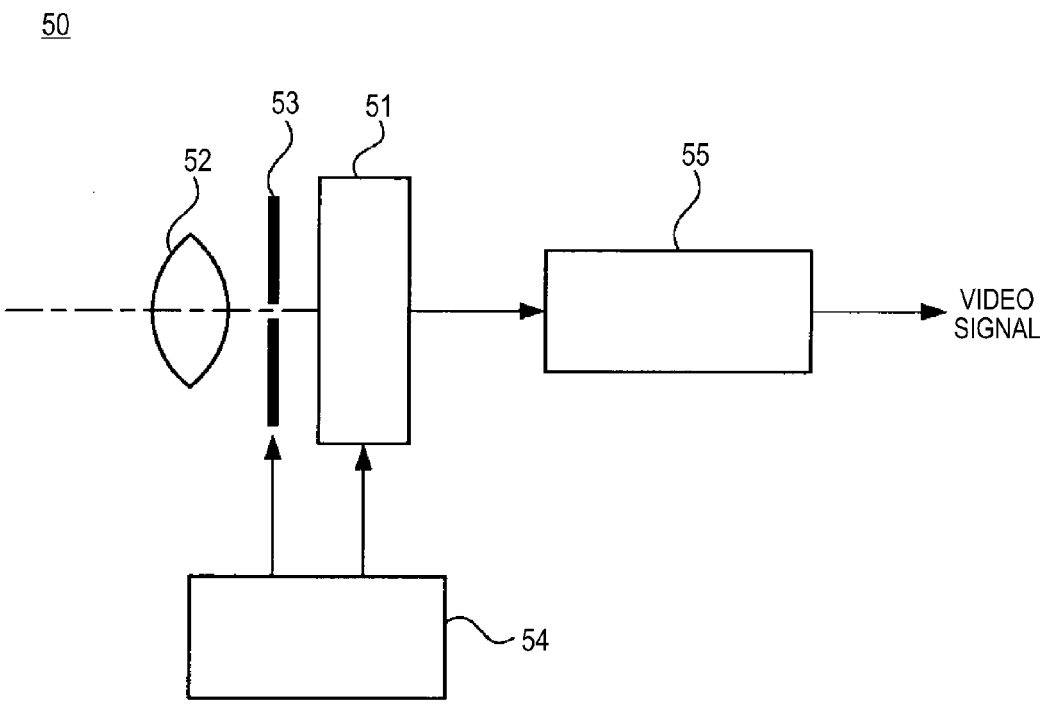
FIG. 12 shows the configuration of an electronic apparatus.

The solid-state imaging device described above can be used in a camera system, such as a digital camera and a video camcorder; a mobile phone having an imaging capability; and other electronic apparatus having an imaging capability. FIG. 12 shows a schematic configuration of an apparatus in which the solid-state imaging device is used with a camera capable of capturing a still image or video images as an example of an electronic apparatus.

A camera 50 in this example includes a solid-state imaging device 51, an optical system 52 that guides incident light to a light receiving sensor portion of the solid-state imaging device 51, a shutter 53 provided between the solid-state imaging device 51 and the optical system 52, and a drive circuit 54 that drives the solid-state imaging device 51. The camera 50 further includes a signal processing circuit 55 that processes an output signal from the solid-state imaging device 51.

The solid-state imaging device 51 can be either of the solid-state imaging devices of the embodiment described above and a second embodiment. The optical system (optical lens) 52 focuses image light (incident light) from a subject on an imaging surface (not shown) of the solid-state imaging device 51. Signal charge is thus accumulated for a fixed period in the solid-state imaging device 51. The optical system 52 may be formed of an optical lens group including a plurality of optical lenses. The shutter 53 controls a period during which the solid-state imaging device 51 is illuminated with the incident light and a period during which the incident light to the solid-state imaging device 51 is blocked.

The drive circuit 54 supplies drive signals to the solid-state imaging device 51 and the shutter 53. Using the supplied drive signals, the drive circuit 54 controls signal output operation of the solid-state imaging device 51 to the signal processing circuit 55 and shuttering operation of the shutter 53. That is, in this example, one of the drive signals (timing signal) supplied from the drive circuit 54 allows the signal from the solid-state imaging device 51 to be transferred to the signal processing circuit 55.

The signal processing circuit 55 performs a variety of types of signal processing on the signal transferred from the solid-state imaging device 51. The signal having undergone the variety of signal processing (video signal) is stored in a memory of any other storage medium (not shown) or outputted to a monitor (not shown).

The above description has been made with reference to the case where the solid-state imaging device according to each of the above embodiments is used as an image sensor having unit pixels that are arranged in a matrix and detect signal charge according to the amount of visible light as a physical quantity. The solid-state imaging device described above can also be used as the entire range of column-type solid-state imaging devices having a column circuit provided for each pixel column in a pixel array section.

Further, the solid-state imaging device described above is not necessarily used as a solid-state imaging device that detects the distribution of incident visible light to capture an image but can be used as a solid-state imaging device that captures an image of the distribution of the amount of incident infrared light, X rays, particles, or any other substance. Moreover, the solid-state imaging device described above can be used as the entire range of solid-state imaging devices in a broad sense that detect the distribution of pressure, static capacitance, or any other physical quantity to capture an image (physical quantity distribution detection apparatus), such as a fingerprint detection sensor.

Further, the solid-state imaging device described above does not necessarily sequentially scan unit pixels in a pixel array section on a row basis to read a pixel signal from each of the unit pixels. For example, the solid-state imaging device described above can be used as an X-Y addressing solid-state imaging device that selects an arbitrary pixel on a pixel basis and reads a signal from the selected pixel on a pixel basis.

Moreover, the solid-state imaging device may be provided in the form of single chip or in the form of module having an imaging capability in which an imaging section and a signal processing section or an optical system are packaged together.

The technology of the present disclosure may also be implemented as the following configurations.

(1) A solid-state imaging device including a first lens layer and a second lens layer, wherein the second lens layer is formed at least at a periphery of each first microlens formed based on the first lens layer, and the second lens layer present at a central portion of each of the first microlenses is thinner than the second lens layer present at the periphery of the first microlens or no second lens layer is present at the central portion of each of the first microlenses.

(2) The solid-state imaging device described in (1), wherein the first lens layer is made of a metal-oxide-containing resin or an inorganic material, and the second lens layer is made of an inorganic material.

(3) The solid-state imaging device described in (1) or (2), wherein the first lens layer has an refractive index n1, the second lens layer has an refractive index n2, and n2≤n1 is satisfied.

(4) The solid-state imaging device described in any of (1) to (3), further including a third lens layer that covers the first lens layer and the second lens layer, and the refractive index of the third lens layer is lower than the refractive indices of the first lens layer and the second lens layer.

(5) The solid-state imaging device described in (4), wherein a surface of the third lens layer is planarized.

(6) The solid-state imaging device described in any of (1) to (5), wherein the second lens layer formed at the central portion of each of the first microlenses has a thickness Tt, the second lens layer formed at the periphery of the first microlens has a thickness Tb, and 0≤Tt<Tb is satisfied.

(7) A method for manufacturing a solid-state imaging device including a first lens layer and a second lens layer, the method including forming first microlenses having an inter-pixel gap therebetween based on the first lens layer, and forming the second lens layer at least at a periphery of each of the first microlenses, wherein in the formation of the second lens layer, the second lens layer formed at a central portion of each of the first microlenses is thinner than the second lens layer formed at the periphery of the first microlens or no second lens layer is present at the central portion of each of the first microlenses.

(8) An electronic apparatus including the solid-state imaging device described in any of (1) to (6) and a signal processing circuit that processes an output signal from the solid-state imaging device.

The present disclosure contains subject matter related to that disclosed in Japanese Priority Patent Application JP 2011-217423 filed in the Japan Patent Office on Sep. 30, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. An imaging device comprising:
a first microlens having a first lens layer and a second lens layer disposed above the first lens layer;
a second microlens disposed adjacent to the first microlens having a third lens layer and a forth lens layer disposed above the third lens layer; and
an inter-pixel gap disposed between the first microlens and the second microlens,
wherein
the first lens layer, the second lens layer, the third lens layer and the fourth lens layer each have a thickness greater than zero throughout the inter-pixel gap,
a periphery of the first microlens is disposed between the inter-pixel gap and a center portion of the first microlens,
a periphery of the second microlens is disposed between the inter-pixel gap and a center portion of the second microlens,
a thickness of the second lens layer at the center portion of the first microlens is less than a thickness of the second lens layer at the periphery of the first microlens, and
a thickness of the fourth lens layer at the center portion of the second microlens is less than a thickness of the forth lens layer at the periphery of the second microlens.

2. The imaging device according to claim 1, wherein the first lens layer and the third lens layer each include at least one material selected from among the group consisting of silicon, an oxide, a nitride and any combination thereof.

3. The imaging device according to claim 1, wherein first lens layer and the third lens layer are selected from among the group consisting of SiON, SiN and any combination thereof.

4. The imaging device according to claim 1, wherein the second lens layer and the forth lens layer each include at least one material selected from among the group consisting of silicon, an oxide, a nitride, carbon and any combination thereof.

5. The imaging device according to claim 1, wherein the second lens layer and the forth lens layer are selected from among the group consisting of SiON, SiN, SiO, SiOC and any combination thereof.

6. The imaging device according to claim 1 further comprising a pixel section and a peripheral circuit section.

7. The imaging device according to claim 6, wherein the pixel section includes a transfer transistor, a rest transistor and an amplification transistor.

8. The imaging device according to claim 7, wherein pixel section further includes a selection transistor.

9. The imaging device according to claim 6, wherein the peripheral circuit section includes a vertical drive circuit, one or more column processing circuits, a horizontal drive circuit, an output circuit, and a control circuit.

10. The imaging device according to claim 9, wherein the one or more column processing circuits are configured to perform correlated double sampling (CDS).

11. The imaging device according to claim 1 further comprising a substrate that includes one or more photodiodes, wherein the first microlens, the second microlens and the inter-pixel gap are disposed above the substrate.

12. The imaging device according to claim 11, further comprising an insulating layer formed of a single layer or multiple layers, wherein the insulating layer is disposed above the substrate and wherein the insulating layer is disposed below the first microlens, the second microlens and the inter-pixel gap.

13. The imaging device according to claim 12, wherein the insulating layer comprises a single-layer structure of SiO or a multiple-layer structure of $HfO_2$ and SiO.

14. The imaging device according to claim 13 further comprising an inter-pixel blocking layer formed from at least one material selected from among the group consisting of W, Al, Cu, a carbon black, a titanium black, a metal black, or an organic material.

15. The imaging device according to claim 14 further comprising a first planarization layer formed on the insulating layer.

16. The imaging device according to claim 15, wherein the first planarization layer includes an acrylic resin.

17. The imaging device according to claim 16 further comprising one or more color filters formed on the first planarization layer.

18. The imaging device according to claim 17 further comprising a second planarization layer formed on the one or more color filters.

19. The imaging device according to claim 18, wherein the second planarization layer includes an acrylic resin, a styrene resin, or a styrene-acryl copolymerizing resin.

20. The imaging device according to claim 19 further comprising a buffer layer formed on the second planarization layer and including SiO or SiON.

* * * * *